United States Patent [19]

Chiu

[11] Patent Number: 5,286,999
[45] Date of Patent: Feb. 15, 1994

[54] FOLDED BUS BAR LEADFRAME

[75] Inventor: Anthony M. Chiu, Richardson, Tex.

[73] Assignee: Texas Instruments Incorporated, Dallas, Tex.

[21] Appl. No.: 941,596

[22] Filed: Sep. 8, 1992

[51] Int. Cl.⁵ ............................................. H01L 23/48
[52] U.S. Cl. .................................... 257/666; 257/691; 257/692; 257/696; 257/700
[58] Field of Search ............... 257/689, 666, 676, 691, 257/692, 700, 696

[56] References Cited

U.S. PATENT DOCUMENTS 4,862,245 8/1989 Pashby et al. ........................ 257/666
4,965,654 10/1990 Karner et al. ........................ 257/676
5,105,257 4/1992 Michii ................................. 257/691

Primary Examiner—William Mintel
Assistant Examiner—Roy Potter
Attorney, Agent, or Firm—Stanton C. Braden; Richard C. Donaldson

[57] ABSTRACT

A leadframe has a bus bar extending between two lead fingers on the leadframe. The bus bar and lead fingers are etched to reduce the thickness thereof, and the bus bar is folded under the lead finger, but insulated therefrom by a strip of insulating material. An adhesive is applied to the bus bar to attach it and the leadframe to the surface of a semiconductor chip.

10 Claims, 2 Drawing Sheets

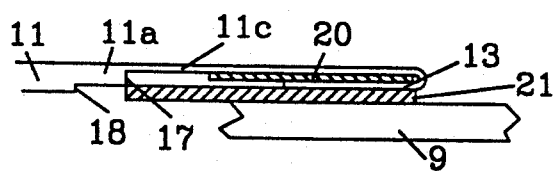
FIGURE 3
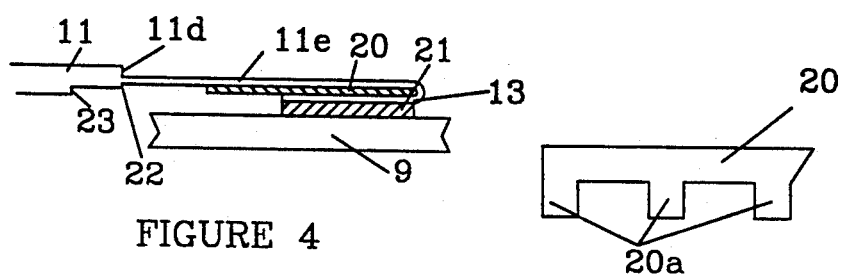
FIGURE 4
FIGURE 5a
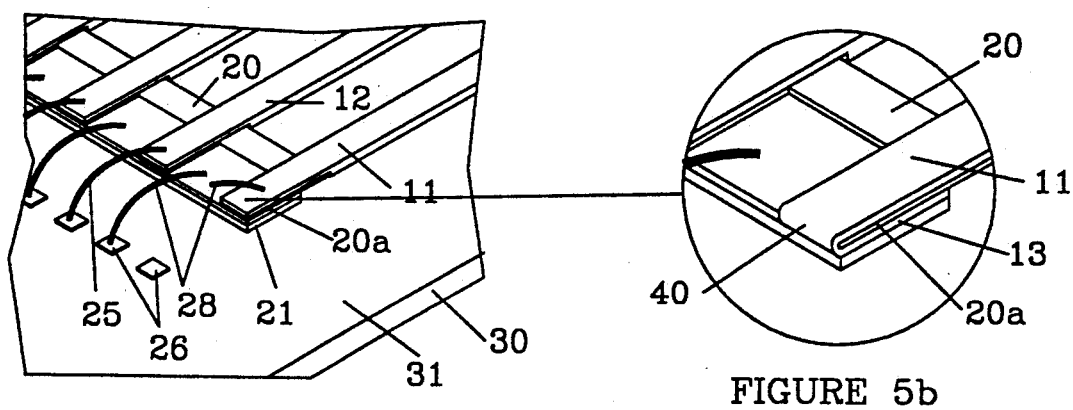
FIGURE 5
FIGURE 5b

FOLDED BUS BAR LEADFRAME

FIELD OF THE INVENTION

This invention relates to leadframes for semiconductor devices, and more particularly to a bus bar on a lead frame which is folded and underlies lead fingers on a leadframe that are attached to contact areas on the semiconductor device.

BACKGROUND OF THE INVENTION

In many semiconductor devices, bus bars are used to distribute operating voltages to several contact areas on the semiconductor device, and to provide a ground bus to individual contact areas. The bus bar is usually in the same general location or position of the lead finger tips. Also, if the bus bar extends the length of the semiconductor device, the lead wires between the lead fingers and the contact areas of the semiconductor device must extend over the bus bar to make contact between the lead fingers and the contacts areas. When the lead wire extend over the bus bar, there is the possibility of short between the bus bar and lead wires. Also the extending of the lead wire to over the bus bar requires longer lead wire making the lead wire more susceptible to sagging and shorting against the bus bar.

BRIEF SUMMARY OF THE INVENTION

The invention is to a leadframe in which a bus bar is formed as a part of the lead frame and spans, for example, the outer two lead fingers of the leadframe. The bus bar is bent under the other lead fingers and is insulated therefrom to prevent an electrical connection between the bus bars and lead fingers extend over the bus bar.

The lead fingers and bus bar are etched to reduce the thickness thereof so that the thickness of the lead fingers, the bus bar and the insulating material between the bus bar and lead fingers all together is approximately the same thickness as the original lead fingers and bus bar before etching.

A strip of adhesive is placed under the bus bar to attached the lead frame to the surface of the semiconductor device. With the bus bar folded under, and insulated from, contact may be made from the various lead fingers to the contact areas on the semiconductor device without wires extend over the bus bar.

The technical advance represented by the invention as well as the objects thereof will become apparent from the following description of a preferred embodiment of the invention when considered in conjunction with the accompanying drawings, and the novel features set forth in the appended claims.

BRIEF DESCRIPTIONS OF THE DRAWINGS

FIG. 3 shows etching of the leadframe leads and bus bar;

FIG. 4 shown another method of etching the leadframe fingers and bus bar;

FIG. 5 illustrates attaching bond wires between the leadframe fingers and bus bar to the semiconductor contacts;

FIG. 5a shows the insulating tape pattern between the folded bus bar and leadframe fingers; and FIG. 5b is an enlarged view of the folded connection between the two end lead fingers and the bus bar.

DESCRIPTION OF A PREFERRED EMBODIMENT

Figure 1:
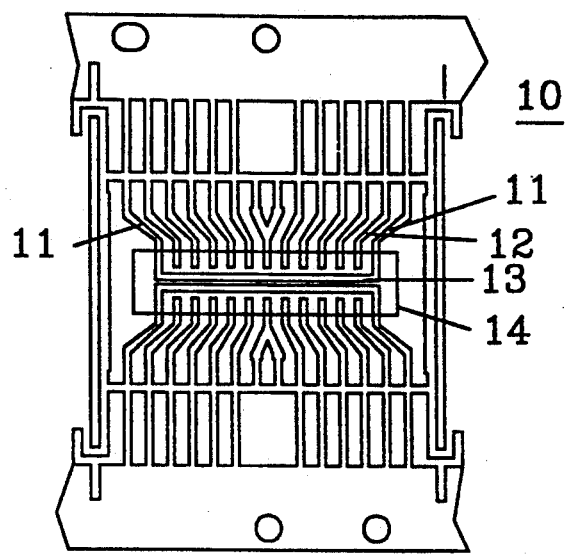
FIG. 1 illustrates a leadframe as etched and indicating additionally etched areas.

FIG. 1 is a leadframe 10 having a plurality of lead fingers 12. Two lead fingers 11, on each end of the array of lead fingers 12 are connected to each other by a bus bar 13. The parts of lead fingers 11 and 12, and the bus bar 13, enclosed within the area bounded by rectangle 14 are etched to reduce the thickness of the lead fingers 11 and 12 and bus bar 13. The leads and bus bar can be etched in several ways to reduce the thickness of the leads and bus bar, as hereinafter described. Bus bar 13 is folded under lead fingers 12 and 11 in a subsequent process step.

Figure 2:
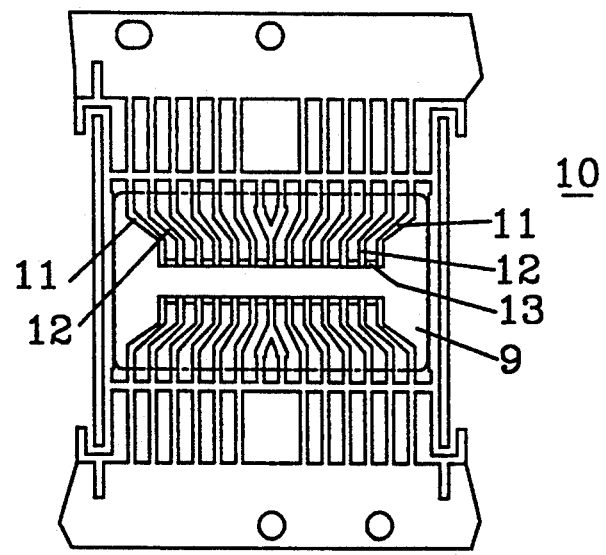
FIG. 2 shows a folded bus bar.

FIG. 2 shows leadframe 10 after bus bar 13 has been folded under lead fingers 11 and 12. A strip of insulating material is placed on bus bar 13 before folding so that it does not short against lead fingers 12.

FIG. 3 illustrates one method of etching lead fingers 11 and 12 and bus bar 13. Only lead finger 11 and bus bar 13 are shown in FIG. 3. The end of lead fingers 12 would be etched in a similar manner to reduce thickness. The lead fingers originally are, for example, 3 mils thick. Lead finger is first etched to reduce a portion 11a as indicated at step 18. A second etching, step 17, reduces the thickness of etched portion 11c to 1 mil thick. Bus 13 is also etched to reduce its thickness to 1 mil. After reducing the lead fingers and bus bar, bus bar 13 is folded under the lead fingers 11 and 12. A strip of insulating material 20 approximately 1 mil thick is placed between bus 13 and lead fingers 11 and 12. A strip of tape or adhesive 21 is placed under the folded bus bar attaching the bus bar to the surface of a semiconductor chip 9. The total thickness of lead finger 11c, insulator 20, bus bar 13 are approximately 3 mils, the original thickness of lead fingers 11 and 12 and bus bar 13. Therefore, the folded under bus bar, lead fingers and insulating material doe not increase the overall thickness of the semiconductor chip, lead and package.

FIG. 4 illustrates a second method of etching the lead fingers and the bus bar. As, illustrated, lead finger 11 is etch from the top to from the reduced section step 11d. Lead finger 11 is also etched from the bottom at two steps, the first step at 23 and the second step at 22. The original thickness of lead figures 11 and 12 is about 3 mils. the resulting etched thickness of lead finger 11a is approximately 1 mil. Lead finger 11e is folded at its connection to bus bar 13 such that bus bar is folded under the ends of lead fingers 11 and 12. A strip of insulating material 20 is placed between bus bar 13 the end of lead fingers 11 and 12. A strip of tape or adhesive 21 is placed under the folded bus bar 13 to attached the bus bar/lead finger assembly to the surface of a semiconductor chip.

FIG. 5 shows the leadframe structure of the present invention attached to a semiconductor chip. Each of leadframe leads 11 and 12 are secured to the semiconductor device through insulating material 21, insulating the lead fingers from bus bar 13. Bus bar 13 is attached to the surface 31 of semiconductor chip 30 by tape/adhesive 21. Each lead finger 12 is attached to a bond pad 26 on semiconductor chip 30 by a bond wire 25. Bus bar 13 is attached to various bond pads 26 by bond wires 28. As illustrated the structure of the invention permits connections by the various lead fingers without crossing over a bus bar, and the bus bar is connected to desired contact pads of the semiconductor along the length of the semiconductor chip without interfering with other connection on the semiconductor chip. In the configuration of FIG. 5, the lead fingers are etch to one-half the original thickness. also, lead fingers 11 have been detached from the bus bar 13 at the end of the lead finger such there is no electrical connection between lead fingers 11 and bus bar 13.

FIG. 5a shows the shape of the insulating tape between the leadframe fingers 11, 12 and the bus bar 13. Insulating tape 20 has fingers 20a that extends under the leadframe fingers and bus bar 13.

FIG. 5b is an enlarged view of the end of lead finger 11. In this embodiment, lead finger 11 is folded at 40 and wrapped around and connected to bus bar 13 as illustrated in FIGS. 3 and 4. In the embodiment of FIG. 5, since the connection between the two end lead fingers 11 and bus bar 13 (as in FIG. 2) has been severed, any of the lead fingers can be attached to bus bar 13, for example with bond wires such as bond wires 28, FIG. 5, to provide either a power bus or ground bus.

What is claimed is:

1. A leadframe for attaching to a semiconductor device;
   a plurality of lead fingers on said lead frame;
   a strip of insulating material; and
   a bus bar attached to at least two lead fingers, said bus bar folded at the point of attachment to said at least two lead fingers to underlie said lead fingers and insulated therefrom by said insulating material.

2. The lead frame according to claim 1, wherein said lead fingers and bus bar have a thickness which is less than a thickness of the leadframe.

3. The leadframe according to claim 1, wherein there is an adhesive material attached to said bus bar for securing the bus bar and leadframe to the surface of a semiconductor device.

4. The leadframe according to claim 1, including an adhesive strip under said bus bar, wherein a combined thickness of said bus bar, insulating material and lead fingers does not exceed a thickness of the leadframe material.

5. The leadframe according to claim 1, wherein said lead frame is at least 3 mils thick and the lead frame fingers and bus bar are at least 1 mil thick.

6. A leadframe for attaching to a semiconductor device;
   a plurality of lead fingers on said leadframe;
   a strip of insulating material; and
   a bus bar having a thickness less than the thickness of the leadframe attached to at least two lead fingers, said bus bar folded at the point of attachment to said at least two lead fingers to underlie said lead fingers and insulated therefrom by said insulating material.

7. The lead frame according to claim 6, wherein said lead fingers and bus bar have a thickness which is less that the thickness of the leadframe.

8. The leadframe according to claim 6, wherein there is an adhesive material attached to said bus bar for securing the bus bar and leadframe to the surface of a semiconductor device.

9. The leadframe according to claim 6, wherein said leadframe is at least 3 mils thick and the lead frame fingers and bus bar are at least 1 mil thick.

10. A semiconductor device including a semiconductor chip and a leadframe, comprising:
    a leadframe having a plurality of lead fingers;
    a strip of insulating material;
    a bus bar, folded at the point of attachment to at least two lead fingers, underlying said lead fingers, and electrically insulated therefrom by said strip of insulating material; and
    an adhesive material on said bus bar attaching said leadframe to said semiconductor chip.

* * * * *